(12) United States Patent
Garg et al.

(10) Patent No.: US 12,328,820 B2
(45) Date of Patent: Jun. 10, 2025

(54) PRINTED CIRCUIT BOARD AND A SEMICONDUCTOR PACKAGE INCLUDING THE SAME

(71) Applicant: SAMSUNG ELECTRO-MECHANICS CO., LTD., Suwon-si (KR)

(72) Inventors: Gopal Garg, Suwon-si (KR); Jung Hyun Cho, Suwon-si (KR); Yong Ho Baek, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 330 days.

(21) Appl. No.: 17/954,603

(22) Filed: Sep. 28, 2022

(65) Prior Publication Data
US 2023/0292439 A1    Sep. 14, 2023

Related U.S. Application Data

(60) Provisional application No. 63/319,575, filed on Mar. 14, 2022.

(51) Int. Cl.
*H05K 1/18* (2006.01)
*H05K 1/11* (2006.01)

(52) U.S. Cl.
CPC ............. *H05K 1/181* (2013.01); *H05K 1/115* (2013.01)

(58) Field of Classification Search
CPC .............................. H05K 1/181; H05K 1/115

USPC ......................................................... 174/250
See application file for complete search history.

(56) References Cited

U.S. PATENT DOCUMENTS

| 10,153,177 B2 | 12/2018 | Sorimachi | |
| 2015/0116965 A1 | 4/2015 | Kim et al. | |
| 2020/0020638 A1* | 1/2020 | Heo | H01L 23/5383 |
| 2020/0105676 A1* | 4/2020 | Jin | H01L 25/0655 |

FOREIGN PATENT DOCUMENTS

KR    10-2020-0069573 A    6/2020

OTHER PUBLICATIONS

English Translation of KR 20200069573A; Kim et al; Published: Jun. 17, 2020 (Year: 2020).*

* cited by examiner

*Primary Examiner* — Timothy J Thompson
*Assistant Examiner* — Sidi M Maiga
(74) *Attorney, Agent, or Firm* — Morgan, Lewis & Bockius LLP

(57) ABSTRACT

A printed circuit board includes a substrate structure including a first insulating material, a plurality of first wiring layers disposed on or in the first insulating material, and a plurality of first via layers disposed in the first insulating material; and an interconnect structure including a second insulating material, a plurality of second wiring layers disposed on or in the second insulating material, and one or more second via layers disposed in the second insulating material. The interconnect structure is disposed on an upper side of the substrate structure. The interconnect structure includes first and second connection regions. The first and second connection regions are spaced apart from each other.

23 Claims, 24 Drawing Sheets

PRINTED CIRCUIT BOARD AND A SEMICONDUCTOR PACKAGE INCLUDING THE SAME

CROSS-REFERENCE TO RELATED APPLICATIONS

This application claims benefit of priority to U.S. Patent Application No. 63/319,575 filed on Mar. 14, 2022 in the United States Patent and Trademark Office, the disclosure of which is incorporated herein by reference in its entirety.

TECHNICAL FIELD

The present disclosure relates to a printed circuit board and a semiconductor package including the same.

BACKGROUND

As the number of CPU and GPU cores of server products has rapidly increased, a die-splitting technique of effectively increasing the number of cores has been widely used. Also, as the demand for a package including a high bandwidth memory (HBM) has increased, a technique for connecting a die to a die with a fine circuit line width has been necessary. To satisfy these technical requirements, a technique of embedding a silicon bridge and a technique of using a silicon interposer have been developed, but there is a limitation in commercialization thereof due to a price and a complicated assembly process. For example, the technique of embedding silicon bridges may have an alignment issue as the alignments of silicon bridges are different when a plurality of dies are connected to each other, and undulation may occur on a front surface of a substrate on which a die is mounted, such that there may be an issue in a packaging yield. Also, the technique of using a silicon interposer is expensive, and the process of manufacturing the same is complicated.

SUMMARY

An aspect of the present disclosure is to provide a printed circuit board which may address an alignment issue related to interconnection which may accumulate as the number of semiconductor chips to be mounted increases, and a semiconductor package including the same.

Another aspect of the present disclosure is to provide a printed circuit board of which flatness of a front surface on which a semiconductor chip is mounted may be excellent such that a packaging yield may improve, and a semiconductor package including the same.

According to an aspect of the present disclosure, a printed circuit board may be manufactured by pre-manufacturing a interconnect structure including a plurality of connection regions separated from each other, implanting a portion or the entirety of the interconnect structure prepared in advance on a carrier, and forming a substrate structure thereon by a build-up process.

According to an aspect of the present disclosure, a printed circuit board includes a substrate structure including a first insulating material, a plurality of first wiring layers disposed on or in the first insulating material, and a plurality of first via layers disposed in the first insulating material; and an interconnect structure including a second insulating material, a plurality of second wiring layers disposed on or in the second insulating material, and one or more second via layers disposed in the second insulating material. The interconnect structure is disposed on an upper side of the substrate structure. The interconnect structure includes first and second connection regions. The first and second connection regions are spaced apart from each other and are not connected to each other in the interconnect structure.

According to an aspect of the present disclosure, a semiconductor package includes a printed circuit board including a substrate structure and an interconnect structure disposed on an upper side of the substrate structure, where the interconnect structure includes first and second connection regions including a wiring layer and a via layer, respectively, and the first and second connection regions are spaced apart from each other and are not connected to each other in the interconnect structure; a first semiconductor chip mounted on the printed circuit board; a second semiconductor chip mounted on the printed circuit board and connected to the first semiconductor chip through the first connection region; and a third semiconductor chip mounted on the printed circuit board and connected to the first semiconductor chip through the second connection region.

According to an aspect of the present disclosure, a printed circuit board includes a substrate structure including a first insulating material, a plurality of first wiring layers disposed on or in the first insulating material, and a plurality of first via layers disposed in the first insulating material; and an interconnect structure including a second insulating material, a plurality of second wiring layers disposed on or in the second insulating material, and one or more second via layers disposed in the second insulating material. A side surface of an uppermost portion of the second insulating material is in contact with the first insulating material. One or more vias of the plurality of first via layers extends from one of the plurality of second wiring layers. The first insulating material and the second insulating material provide portions of an outermost surface of the printed circuit board.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Figure 1:
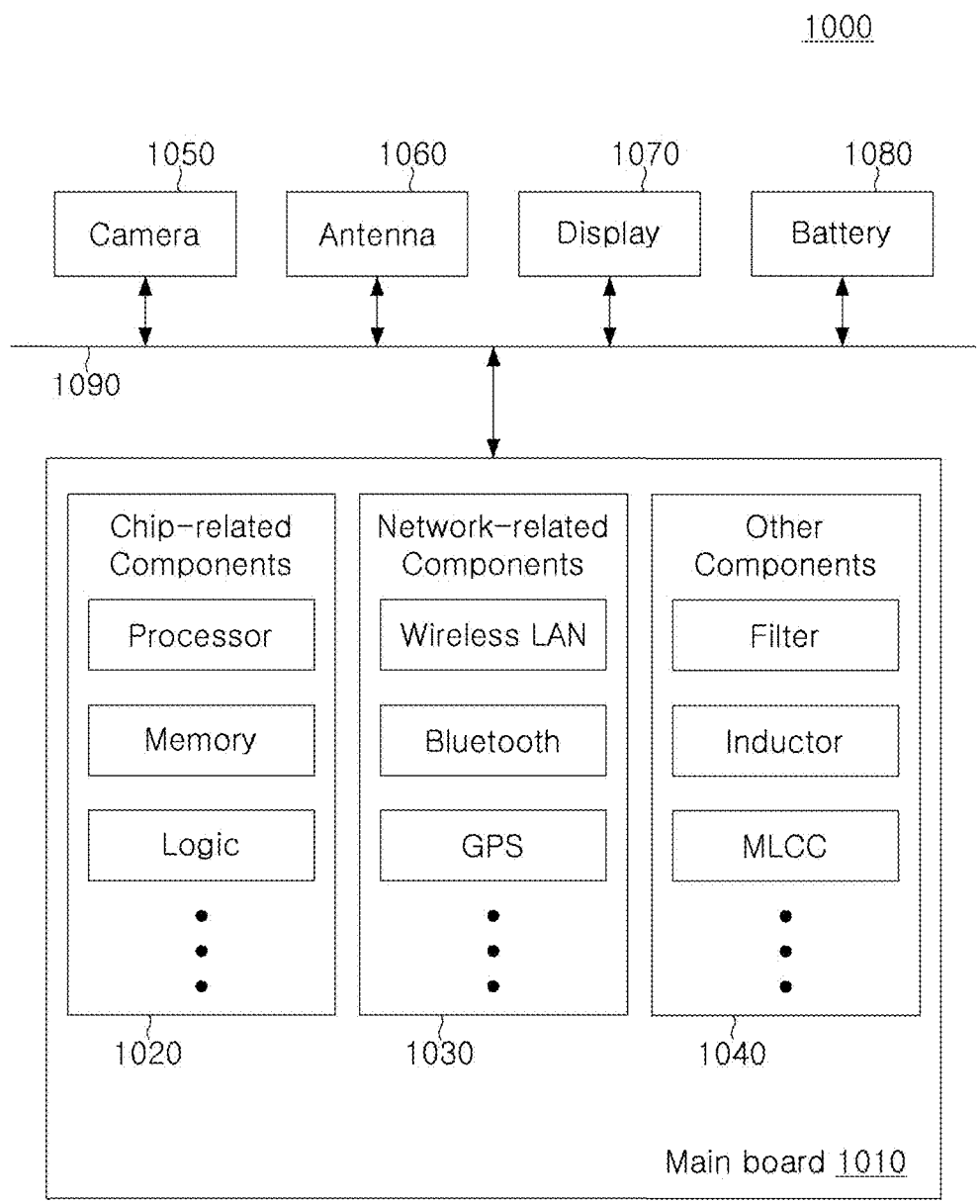
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. Also, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. Also, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. The other components may include, for example, a camera module 1050, an antenna 1060, a display device 1070, and a battery 1080. However, the other components are not limited thereto, and may include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. The other components may also include other components used for various purposes depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
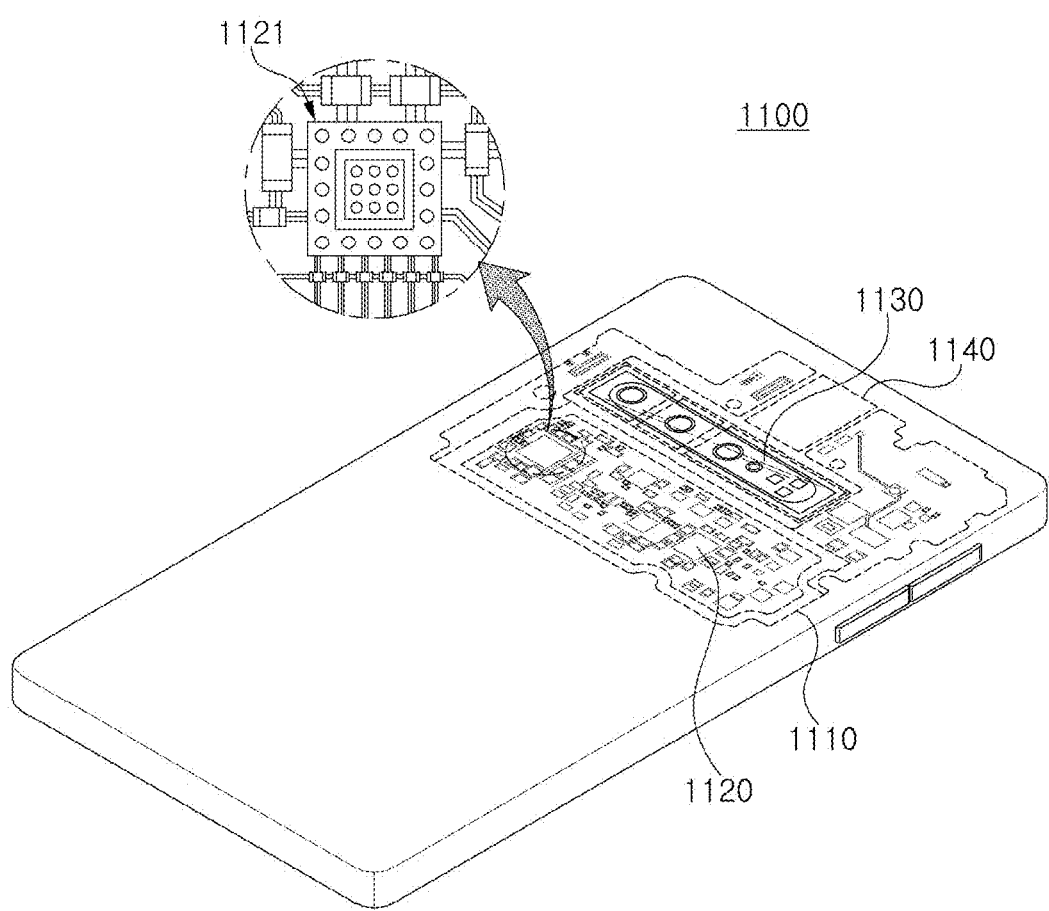
FIG. 2 is a perspective diagram illustrating an example of an electronic device.

FIG. 2 is a perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. Also, other components that may or may not be physically or electrically connected to the motherboard 1110, such as a camera module 1130, may be accommodated in the body 1101. A portion of the electronic components 1120 may be the chip related components, a component package 1121, for example, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. The electronic device is not necessarily limited to the smartphone 1100, but may be other electronic devices as described above.

Semiconductor Package Including Interposer

Generally, a semiconductor chip may have a great number of micro-electric circuits integrated therein, but the semiconductor chip may not work as a finished semiconductor product by itself, and it may be highly likely that the semiconductor chip may be damaged by an external physical or chemical impact. Accordingly, instead of using the semiconductor chip as is, the semiconductor chip may be packaged and used in electronic devices in a package state.

The semiconductor packaging may be necessary because there may be a difference in circuit widths of a semiconductor chip and a main board of the electronic device in terms of electrical connection. Specifically, in the case of a semiconductor chip, the size of a connection pad and a spacing between the connection pads may be extremely fine, whereas in the case of a main board used for electronic devices, the size of a component mounting pad and a spacing between the component mounting pads may be relatively larger than the scale of the semiconductor chip. Accordingly, it may be difficult to directly mount the semiconductor chip on such a main board, and a packaging technique for buffering a difference in circuit widths between the semiconductor chip and the main board may be necessary.

Hereinafter, a semiconductor package including an interposer manufactured by such a packaging technique will be described in greater detail with reference to the drawings.

Figure 3:
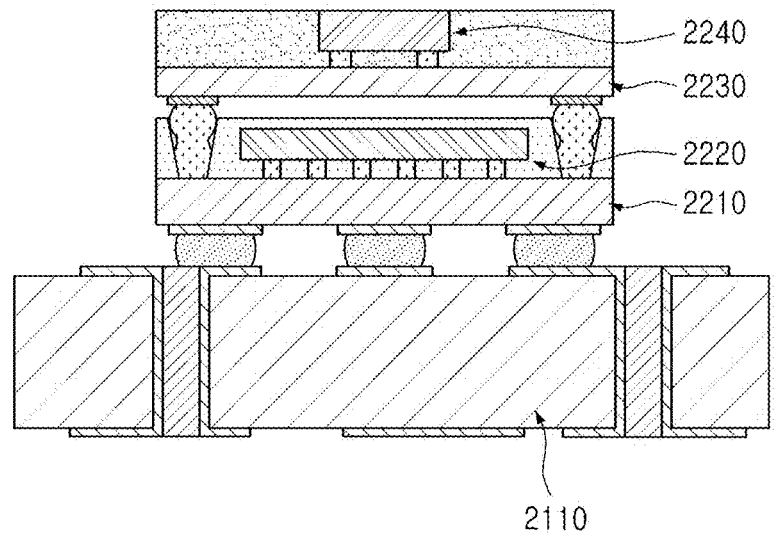
FIG. 3 is a cross-sectional diagram illustrating an example in which a BGA package is mounted on a main board of an electronic device.

FIG. 3 is a cross-sectional diagram illustrating an example in which a BGA package is mounted on a main board of an electronic device.

As for an application specific integrated circuit (ASIC), such as a graphics processing unit (GPU) among semiconductor chips, as the price of each chip may be relatively high, it may be important to perform packaging with a high yield. For this purpose, a ball grid array (BGA) substrate 2210 which may redistribute thousands to hundreds of thousands of connection pads may be prepared before the semiconductor chip is mounted, an expensive semiconductor chip such as a GPU 2220 may be subsequently mounted and packaged on the BGA substrate 2210 using a surface mounting technique (SMT), and may be finally mounted on the main board 2110.

Meanwhile, in the case of the GPU 2220, it may be necessary to reduce a signal path with a memory such as a high bandwidth memory (HBM), and to this end, a semiconductor chip such as an HBM 2240 may be mounted on an interposer 2230 and packaged, and the semiconductor chip may be laminated on the package on which the GPU 2220 is mounted in the form of a package on package (POP). However, in this case, the thickness of the device may increase excessively, and there may be a limitation in reducing the signal path as well.

Figure 4:
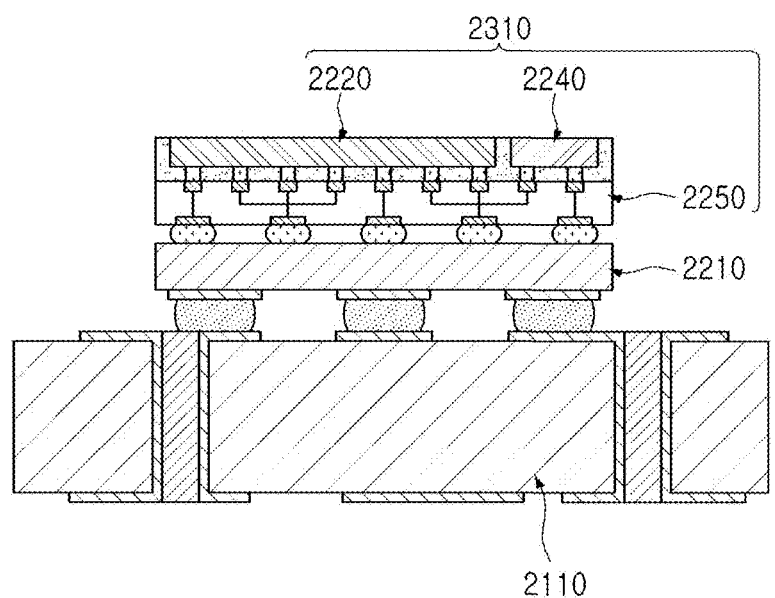
FIG. 4 is a cross-sectional diagram illustrating an example in which a silicon interposer package is mounted on a main board.

FIG. 4 is a cross-sectional diagram illustrating an example in which a silicon interposer package is mounted on a main board.

To address the above-described issue, it may be considered to manufacture a semiconductor package 2310 including an organic interposer using an interposer technique for surface-mounting a first semiconductor chip such as GPU 2220 and a second semiconductor chip such as HBM 2240 on the silicon interposer 2250 side by side and packaging the semiconductor chips. In this case, the GPU 2220 and the HBM 2240 having thousands to hundreds of thousands of connection pads may be redistributed through the interposer 2250, and may be electrically connected to each other through a reduced path. Also, when the semiconductor package 2310 including the organic interposer is mounted again on the BGA substrate 2210 and is redistributed, the semiconductor package 2310 may be finally mounted on the main board 2110.

However, in the case of the silicon interposer 2250, it may be difficult to form a through silicon via (TSV), and the manufacturing cost may also be high, which may be disadvantageous for implementing a large area and reducing the costs.

Figure 5:
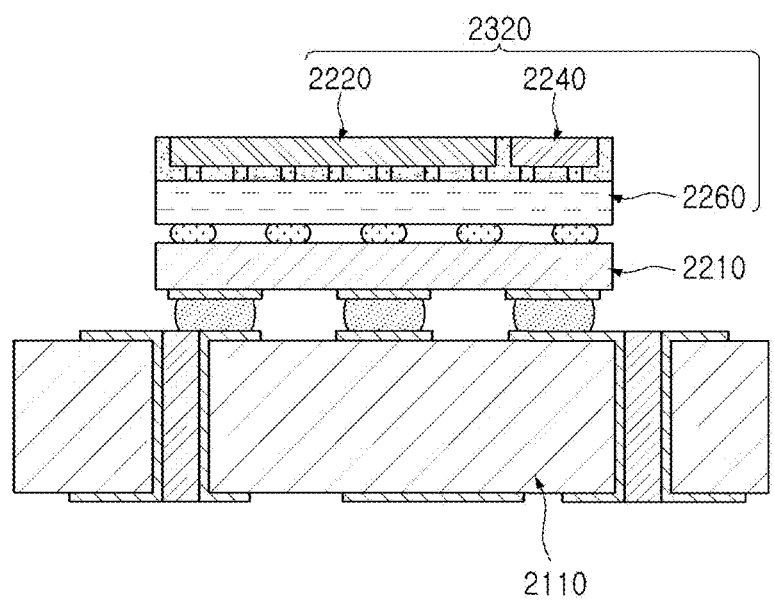
FIG. 5 is a cross-sectional diagram illustrating an example in which an organic interposer package is mounted on a main board.

FIG. 5 is a cross-sectional diagram illustrating an example in which an organic interposer package is mounted on a main board.

To address the above-described issue, it may be considered to use the organic interposer 2260 instead of the silicon interposer 2250. For example, it may be considered to manufacture a semiconductor package 2320 including an organic interposer using an interposer technique for surface-mounting a first semiconductor chip such as GPU 2220 and a second semiconductor chip such as HBM 2240 on the silicon interposer 2250 side by side and packaging the semiconductor chips. In this case, the GPU 2220 and the HBM 2240 having thousands to hundreds of thousands of connection pads may be redistributed through the interposer 2260, and may be electrically connected to each other through a reduced path. Also, by amounting again and redistributing the semiconductor package 2310 including the organic interposer on the BGA substrate 2210, the semiconductor package 2310 may be finally mounted on the main board 2110, which may be advantageous for implementing a large area and reducing the costs.

However, in the case of using the organic interposer 2260, the semiconductor chips 2220 and 2240 may need to be mounted on the organic interposer 2260 and may need to be mounted again on the BGA substrate 2210, the process may become complicated, and a packaging yield may be lowered.

Figure 6:
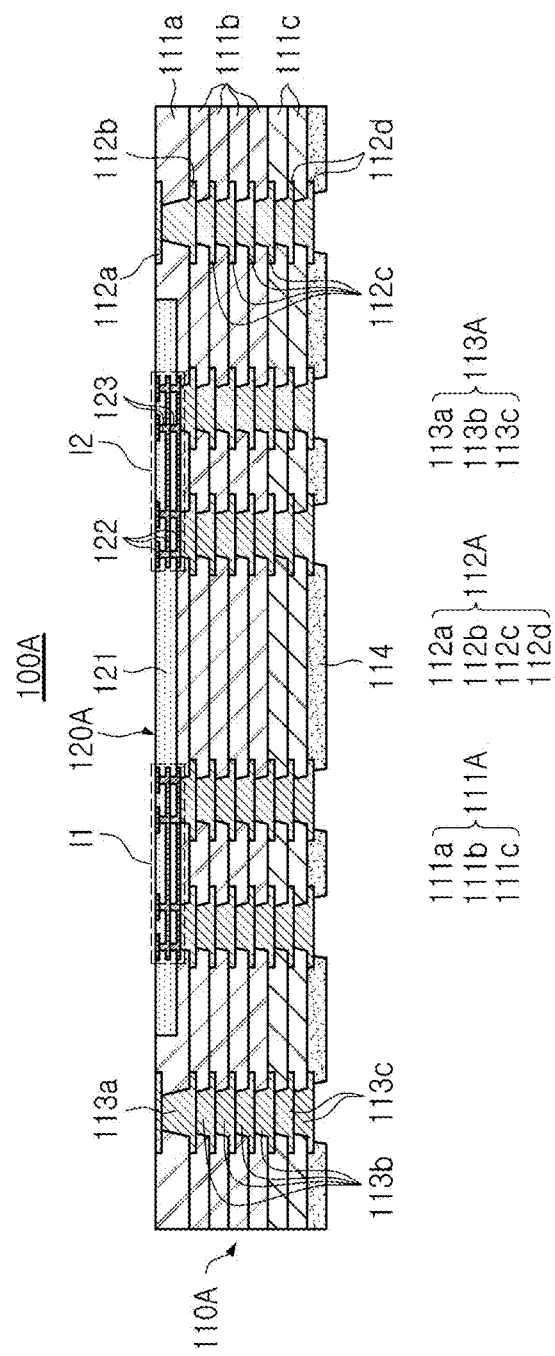
FIG. 6 is a cross-sectional diagram illustrating an example of a printed circuit board.

Printed Circuit Board Including Interconnect Structure and Semiconductor Package FIG. 6 is a cross-sectional diagram illustrating an example of a printed circuit board.

Referring to the drawings, a printed circuit board 100A according to an example may include a substrate structure 110A including a first insulating material 111A, a plurality of first wiring layers 112A disposed on or in the first insulating material 111A, and a plurality of first via layers 113A disposed in the first insulating material 111A, and an interconnect structure 120A disposed on an upper side of the substrate structure 110A and including a second insulating material 121, a plurality of second wiring layers 122 disposed on or in the second insulating material 121, and one or more second via layers 123 disposed in the second insulating material 121.

In this case, the interconnect structure 120A may include first and second connection regions I1 and I2, and the first and second connection regions I1 and I2 may be spaced apart from each other in the interconnect structure 120A and may not be connected to each other. The first and second connection regions I1 and I2 may include wiring layers and via layers, respectively. For example, the first and second connection regions I1 and I2 may include different portions of the plurality of second wiring layers 122 and different portions of the one or more second via layers 123, respectively.

As described above, the printed circuit board 100A according to an example may include a plurality of connection regions I1 and I2 separated from each other, such that the issue of interconnect-related alignment which may be accumulated as the number of mounted semiconductor chips increases. Also, since the interconnect structure 120A having such a structure is disposed on the upper side of the substrate structure 110A, the interconnect structure 120A may provide an outermost mounting surface of the substrate, and accordingly, flatness of the front surface on which the semiconductor chip is mounted may be excellent, which may be effective in improving the packaging yield.

Meanwhile, the interconnect structure 120A may be embedded in the upper side of the substrate structure 110A. For example, the upper surface of the second insulating material 121 may be exposed from the upper surface of the first insulating material 111A, and at least a portion of each of the lower surface and side surfaces of the second insulating material 121 may be covered with the first insulating material 111A. For example, the second insulating material 121 may have an area on a plane, that is, a planar area, smaller than that of the first insulating material 111A. In this case, since the area of the interconnect structure 120A may be reduced, it may be more advantageous in terms of yield.

Meanwhile, the interconnect structure 120A may have higher circuit density than that of the substrate structure 110A. For example, an average pitch of the wirings included in the plurality of second wiring layers 122 may be smaller than an average pitch of the wirings included in the plurality of first wiring layers 112A. The pitch may be measured by imaging a cut-out cross-section of the printed circuit board 100A with a scanning microscope, and the average pitch may be an average value of pitches between wires measured at five arbitrary points. Also, an average interlayer insulation distance between the plurality of second wiring layers 122 may be smaller than an average interlayer insulation distance between the plurality of first wiring layers 112A. The interlayer insulation distance may also be measured by imaging a cut-out cross-section of the printed circuit board 100A with a scanning microscope, and the average interlayer insulation distance may be an average value of the insulation distances between adjacent wiring layers measured at five arbitrary points. That is, the wiring included in the plurality of second wiring layers 122 may be a high-density circuit having a line/space (L/S) smaller than that of the wiring included in the plurality of first wiring layers 112A. As an example, although not limited thereto, the line/space of the wiring included in each of the first and second connection regions I1 and I2 may be about 2/2 μm, but an example embodiment thereof is not limited thereto. Accordingly, the above configuration may be effective for die-to-die interconnection.

Meanwhile, the interconnect structure 120A may have an embedded trace substrate (ETS) structure. For example, the second wiring layer 122 disposed on the uppermost side of the plurality of second wiring layers 122 may be embedded in the upper side of the second insulating material 121 such that the upper surface thereof may be exposed from the upper surface of the second insulating material 121. When the interconnect structure 120A is formed in the form of a coreless substrate as above, wiring design with a fine pitch may be possible. Also, the manufacturing costs may be relatively low as compared to silicon bridge, and the process may be simplified.

Meanwhile, the second insulating material 121 of the interconnect structure 120A may include an organic insulating material. For example, the interconnect structure 120A may be an organic bridge. Accordingly, even when being disposed on the upper side of the substrate structure 110A, differently from the silicon bridge, the reliability issue due to CTE mismatch may hardly occur. Also, the difficulty of the process and the costs for forming the interconnect structure 120A may be reduced. A photoimageable dielectric (PID) may be used as the organic insulating material for forming the microcircuit, but an example embodiment thereof is not limited thereto.

Hereinafter, the components of the printed circuit board 100A according to an example will be described in greater detail with reference to the drawings.

The substrate structure 110A may include a first insulating material 111A, a plurality of first wiring layers 112A disposed on or in the first insulating material 111A, and a plurality of first via layers 113A disposed in the first insulating material 111A. If desired, a passivation layer 114 disposed below the first insulating material 111A and having a plurality of openings for opening at least a portion of the lowermost wiring layer 112d among the plurality of first wiring layers 112A, respectively, may be further included. Meanwhile, the substrate structure 110A may be implemented as a coreless substrate structure, but an example embodiment thereof is not limited thereto, and the substrate structure 110A may be applied to a core substrate structure.

The first insulating material 111A may include a first insulating layer 111a covering the interconnect structure 120A, a plurality of second insulating layers 111b laminated below the first insulating layer 111a, and a plurality of third insulating layers 111c laminated on the lower side of the second insulating layer 111b. The number of the plurality of second insulating layers 111b and the plurality of third insulating layers 111c is not limited to any particular example, and may be larger or smaller than the examples illustrated in the drawings. A boundary between the elements may be distinct from each other, or may not be distinct from each other if desired. For example, the boundary between insulating layers including substantially the same insulating material may be ambiguous, but the boundary between insulating layers including different insulating materials may be more easily distinct. However, an example embodiment thereof is not limited thereto, and the boundary may be distinct irrespective of the insulating material.

Each of the first insulating layer 111a, the plurality of second insulating layers 111b, and the plurality of third insulating layers 111c may include an insulating material. As an insulating material, a thermosetting resin such as an epoxy resin, a thermoplastic resin such as polyimide, or a material in which these resins are mixed with an inorganic filler such as silica, or a resin impregnated in a core material such as glass fiber (glass fiber, glass cloth, glass fabric) together with an inorganic filler, such as, for example, an Ajinomoto build-up film (ABF), prepreg, or the like, may be used, but an example embodiment thereof is not limited thereto. As an example, although not limited thereto, each of the first insulating layer 111a and each of the plurality of second insulating layers 111b may include ABF, and each of the plurality of third insulating layers 111c may include prepreg, but an example embodiment thereof is not limited thereto. The first insulating layer 111a may provide an outermost mounting surface of the printed circuit board 100A together with the second insulating material 121. The plurality of second insulating layers 111b and the plurality of third insulating layers 111c may provide a build-up insulating layer to the substrate structure 100A. The plurality of third insulating layers 111c may provide greater rigidity to the substrate structure 100A.

The first insulating layer 111a and the plurality of second insulating layers 111b may include substantially the same insulating material. Substantially the same insulating material may have the same brand name. The plurality of third insulating layers 111c may include insulating materials different from the above material. For example, each of the plurality of third insulating layers 111c may include a core material such as glass fiber, whereas each of the plurality of second insulating layers 111b and the first insulating layer 111a may include a core material such as glass fiber. As an example, although not limited thereto, each of the plurality of third insulating layers 111c may have an elastic modulus greater than each of the plurality of second insulating layers 111b and the first insulating layer 111a. An elastic modulus may refer to a ratio of stress and strain, and as a measurement method, the elastic modulus may be measured, for example, through a standard tensile test specified in JIS C-6481, KS M 3001, KS M 527-3, ASTM D882, but an example embodiment thereof is not limited thereto.

The plurality of first wiring layers 112A may include a 1-1 wiring layer 112a embedded in the upper side of the first insulating layer 111a and having an upper surface exposed from the upper surface of the first insulating layer 111a, a 1-2 wiring layer 112b disposed on the lower surface of the first insulating layer 111a, a plurality of 1-3 wiring layers 112c disposed on the lower surface of each of the plurality of second insulating layers 111b, and a plurality of 1-4 wiring layers 112d disposed on the lower surface of each of the third insulating layer 111c. The plurality of 1-1 wiring layer 112a may be disposed around the second insulating material 121. The number of the plurality of 1-3 wiring layers 112c and the number of the plurality of 1-4 wiring layers 112d is not limited to any particular example, and may be more or less than the examples illustrated in the drawings.

Each of the 1-1 wiring layer 112a, the 1-2 wiring layer 112b, the plurality of 1-3 wiring layers 112c, and the plurality of 1-4 wiring layers 112D may include a metal material. A metal material may include copper (Cu), aluminum (Al), silver (Ag), tin (Sn), gold (Au), nickel (Ni), lead (Pb), titanium (Ti), or alloys thereof. The 1-1 wiring layer 112a may include an electrolytic plating layer (or copper). Each of the 1-2 wiring layer 112b, the plurality of 1-3 wiring layers 112c, and the plurality of 1-4 wiring layers 112D may include an electroless plating layer (or chemical copper) and an electrolytic plating layer (or electrolytic copper). If desired, a copper foil may be further included. Each of the 1-1 wiring layer 112a, the 1-2 wiring layer 112b, the plurality of wiring layers 112c, and the plurality of 1-4 wiring layers 112D may perform various functions depending on a design of the corresponding layer. For example, a ground pattern, a power pattern, and a signal pattern may be included. Here, the signal pattern may include various signals other than a ground pattern and a power pattern, that is, for example, a data signal. Each of these patterns may include a line pattern, plane pattern and/or pad pattern. A surface treatment layer may be formed on an exposed upper surface of the 1-1 wiring layer 112a.

The plurality of first via layers 113A may include a 1-1 via layer 113a penetrating the first insulating layer 111a and electrically connecting the 1-1 wiring layer 112a to the 1-2 wiring layer 112b, a 1-2 via layer 113b penetrating each of the plurality of second insulating layers 111b and electrically connecting the 1-2 wiring layer 112b to the plurality of 1-3 wiring layers 112c, and a 1-3 via layer 113c penetrating each of the plurality of third insulating layers 111c and electrically connecting a lowermost wiring layer 112c of the plurality of 1-3 wiring layers 112c to each of the plurality of 1-4 wiring layers 112d. The number of the plurality of 1-2 via layers 113b and the number of the plurality of 1-3 via layers 113c are not limited to any particular examples, and may be more or less than the examples illustrated in the drawings.

Each of the 1-1 via layer 113a, the plurality of 1-2 via layers 113b, and the plurality of 1-3 via layers 113c may include a metal material. A metal material may include copper (Cu), aluminum (Al), silver (Ag), tin (Sn), gold (Au), nickel (Ni), lead (Pb), titanium (Ti), or alloys thereof. The 1-1 via layer 113a, the plurality of 1-2 via layers 113b, and the plurality of 1-3 via layers 113c may include an electroless plating layer (or chemical copper) and an electrolytic plating layer (or electrolytic copper). Each of the 1-1 via layer 113a, the plurality of 1-2 via layers 113b, and the plurality of 1-3 via layers 113c may perform various functions depending a design of the corresponding layer. For example, a ground via, a power via, and a signal via may be included. A via of each of the 1-1 via layer 113a, the plurality of 1-2 via layers 113b, and the plurality of 1-3 via layers 113c may be a field type via in which the via hole is filled with a metal material, but an example embodiment thereof is not limited thereto, and the vias may be a conformal type via in which a metal material is disposed along the wall surface of the via hole. A via of the 1-1 via layer 113a, the plurality of 1-2 via layers 113b, and the plurality of 1-3 via layers 113c may have a tapered shape in which a width of an upper surface is narrower than a width of a lower surface, and the tapered shapes may be tapered in the same direction.

The passivation layer 114 may be disposed on the lowermost side of the substrate structure 110A and may protect internal components of the substrate structure 110A. The material of the passivation layer 114 is not limited to any particular example. For example, an insulating material may be used, and in this case, a solder resist may be used as the insulating material, but an example embodiment thereof is not limited thereto. An ABF may be used.

The interconnect structure 120A may include a second insulating material 121, a plurality of second wiring layers 122 disposed on or in the second insulating material 121, and one or more second via layers 123 disposed in the second insulating material 121. The interconnect structure 120A may be a silicon bridge manufactured by forming a circuit layer through a deposition process using silicon dioxide as an insulating body, and an organic bridge manufactured by forming a circuit layer using an organic insulating material as an insulating body through a plating process, and the interconnect structure 120A may be an organic bridge as described above, but an example embodiment thereof is not limited thereto.

The second insulating material 121 may provide the body of the interconnect structure 120A. The second insulating material 121 may include an insulating material, and in this case, the insulating material may be a photoimageable dielectric (PID). When a photoimageable dielectric (PID) is used as the material of the second insulating material 121, the thickness of the second insulating material 121 may be reduced and photo-via holes may be formed, such that a plurality of second wiring layers 122 and one or more second via layers 123 may be easily designed with high density. However, the material is not limited thereto, and other organic insulating materials such as ABF may be used. The second insulating material 121 may include a plurality of insulating layers, and the number of the plurality of insulating layers is not limited to any particular example.

The plurality of second interconnection layers 122 may provide a die-to-die interconnection path. The plurality of second wiring layers 122 may perform various functions depending on a design of the corresponding layer, and may include at least a signal pattern. The plurality of second wiring layers 122 may include a metal material such as copper (Cu), aluminum (Al), silver (Ag), tin (Sn), gold (Au), nickel (Ni), lead (Pb), titanium (Ti), or an alloy thereof. The uppermost second wiring layer 122 may include an electrolytic plating layer (or copper), and the other second wiring layers 122 may include an electroless plating layer (or chemical copper) and an electrolytic plating layer (or copper), respectively. The number of the plurality of second wiring layers 122 is also not limited to any particular example. A surface treatment layer may be formed on the exposed upper surface of the uppermost second wiring layer 122.

One or more second via layers 123 may electrically connect the plurality of second wiring layers 122 formed in different layers, and accordingly, an electrical path may be provided in the interconnect structure 120A. The one or more second via layers 123 may perform various functions depending on a design of the corresponding layer, and may include at least a signal via. Each via of the one or more second via layers 123 may include a metal material such as copper (Cu), aluminum (Al), silver (Ag), tin (Sn), gold (Au), nickel (Ni), lead (Pb), titanium (Ti) or an alloy thereof. The components may include an electroless plating layer (or chemical copper) and an electrolytic plating layer (or electrolytic copper), respectively. Each via of the one or more second via layers 123 may be of a field type via in which the via hole is filled with a metal material, but an example embodiment thereof is not limited thereto, and may be a conformal type via in which a metal material is disposed along a wall surface of the via hole. Each of the vias of the one or more second via layers 123 may have a tapered shape in which a width of the upper surface is narrower than a width of the lower surface on a cross-section, and the tapered shapes may be tapered in the same direction. The number of the second via layers 123 is also not limited to any particular example.

FIGS. 7A to 7H are diagrams illustrating an example of processes of manufacturing a printed circuit board.

Figure 7A:
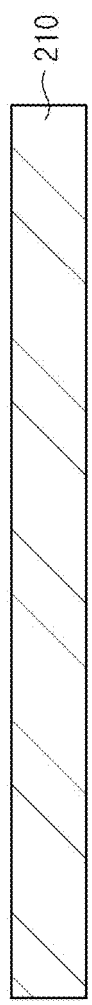
FIGS. 7A to 7H are diagrams illustrating an example of processes of manufacturing a printed circuit board.

Referring to FIG. 7A, the first carrier 210 may be prepared. The first carrier 210 may be a glass carrier, but an example embodiment thereof is not limited thereto.

Figure 7B:
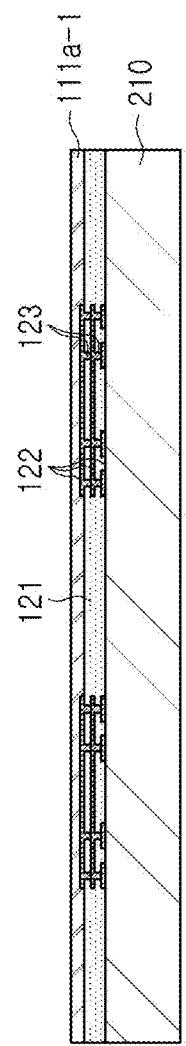

Referring to FIG. 7B, a precursor of the interconnect structure 120A of the ETS structure including the second insulating material 121, a plurality of second wiring layers 122, and a plurality of second via layers 123 may be formed on the first carrier 210 using a coreless process. A first precursor 111*a*-1 of the first insulating layer 111*a* may be disposed on the precursor and may protect the plurality of second wiring layers 122.

Figure 7C:
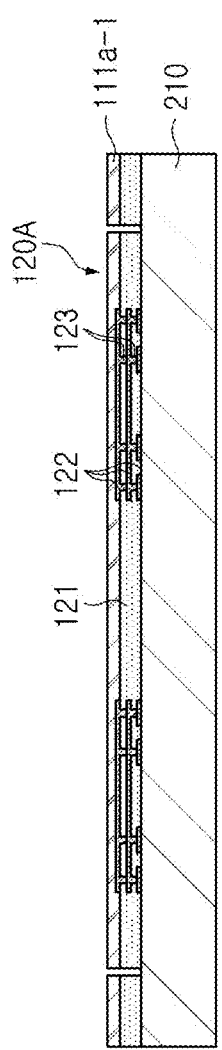

Referring to FIG. 7C, the precursor of the interconnect structure 120A may be cut to an appropriate size using a sawing process, thereby forming the interconnect structure 120A. Thereafter, the interconnect structure 120A may be separated from the first carrier 210.

Figure 7D:
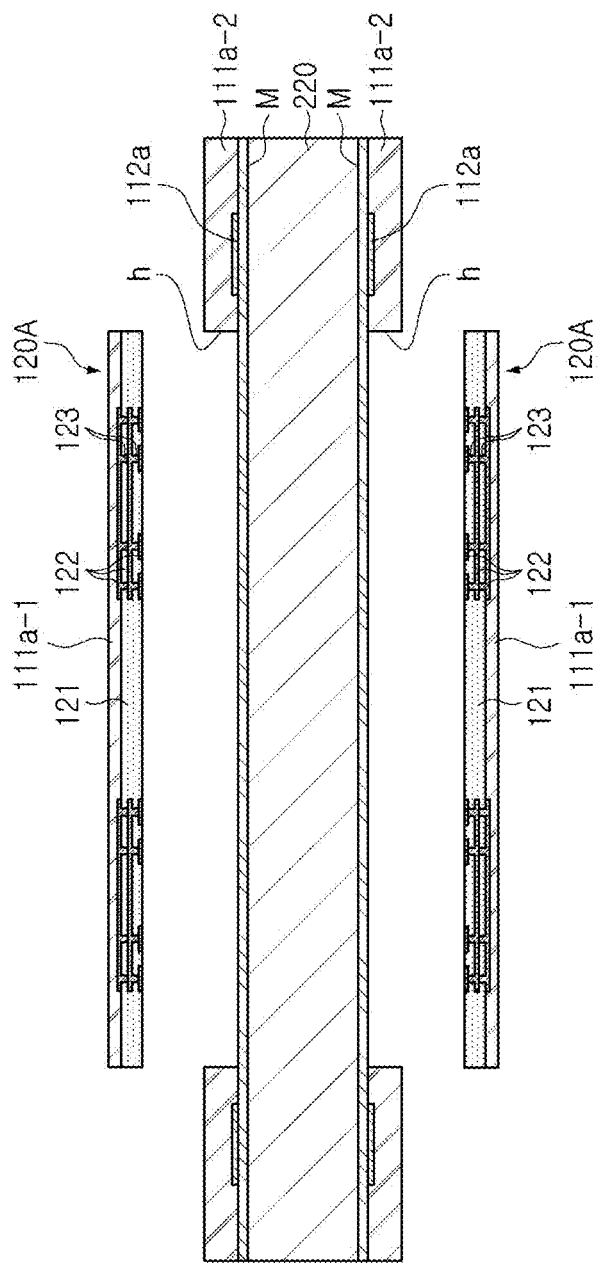

Referring to FIG. 7D, the second carrier 220 may be prepared. The second carrier 220 may be an organic carrier, and the copper foil M may be disposed on both surfaces. Thereafter, a 1-1 wiring layer 112*a* may be formed on the copper foil M by a plating process, may be embedded with the second precursor 111*a*-2 of the first insulating layer 111*a*, and a cavity h may be formed in the second precursor 111*a*-2 of the first insulating layer 111*a*. Thereafter, the pre-manufactured interconnect structure 120A may be disposed in alignment with the cavity h. If desired, an additional insulating layer for forming the first insulating layer 111*a* may be further formed.

Figure 7E:
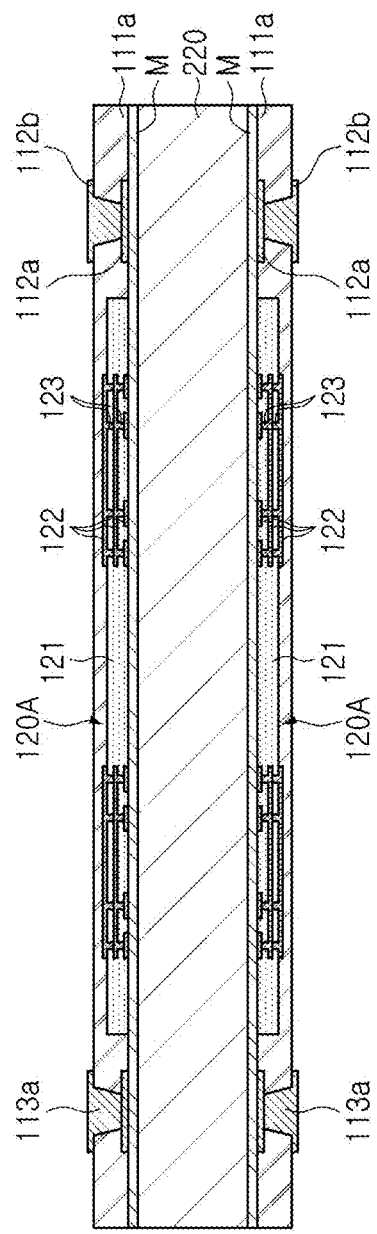

Referring to FIG. 7E, a 1-2 wiring layer 112*b* and a 1-1 via layer 113*a* may be formed by processing a via hole in the first insulating layer 111*a* and performing a plating process.

Figure 7F:
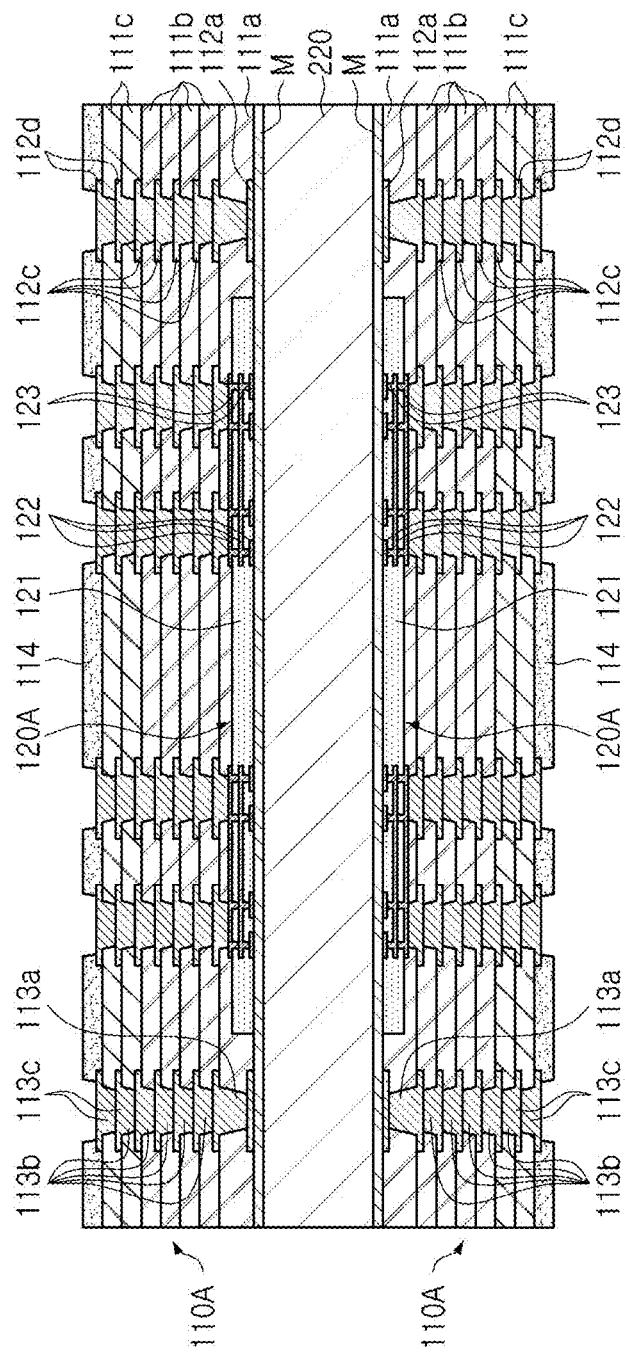

Referring to FIG. 7F, a plurality of 1-3 wiring layers 112*c*, a plurality of 1-4 wiring layers 112*d*, a plurality of 1-2 via layers 113*b*, and a plurality of 1-3 via layers 113*c* may be formed by laminating a plurality of second insulating layers 111*b* and a plurality of third insulating layers 111*c* on the first insulating layer 111*a*, and performing a via hole process and a plating process in the plurality of second insulating layers 111*b* and the plurality of third insulating layers 111*c*, respectively. Thereafter, if desired, the passivation layer 114 may be formed on the outermost side by applying solder resist or ABF lamination, and a plurality of openings may be formed in the passivation layer 114 by a photolithography process or laser processing. Through a series of the processes, the substrate structure 110A may be formed on the copper foil M.

Figure 7G:
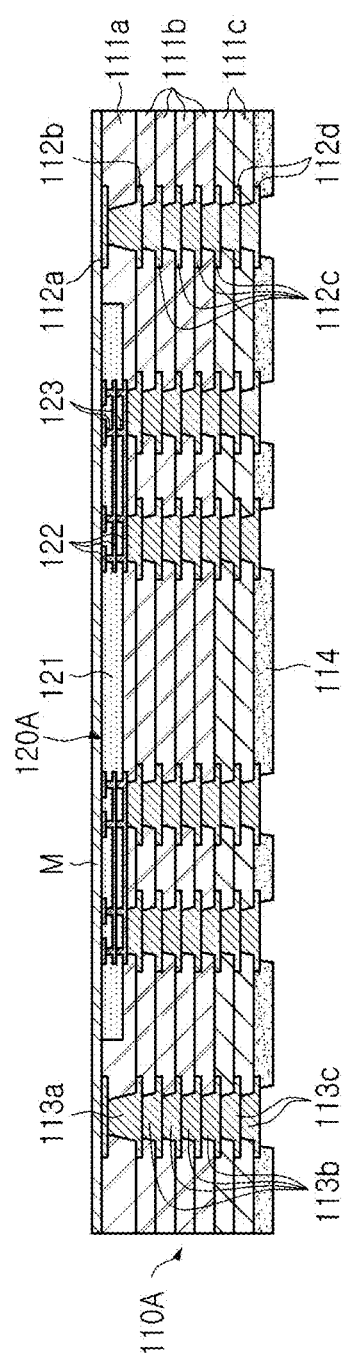

Referring to FIG. 7G, the copper foil M may be separated from the second carrier 220. An interconnect structure 120A and a substrate structure 110A filling the interconnect structure 120A may be disposed on the separated copper foil M.

Figure 7H:
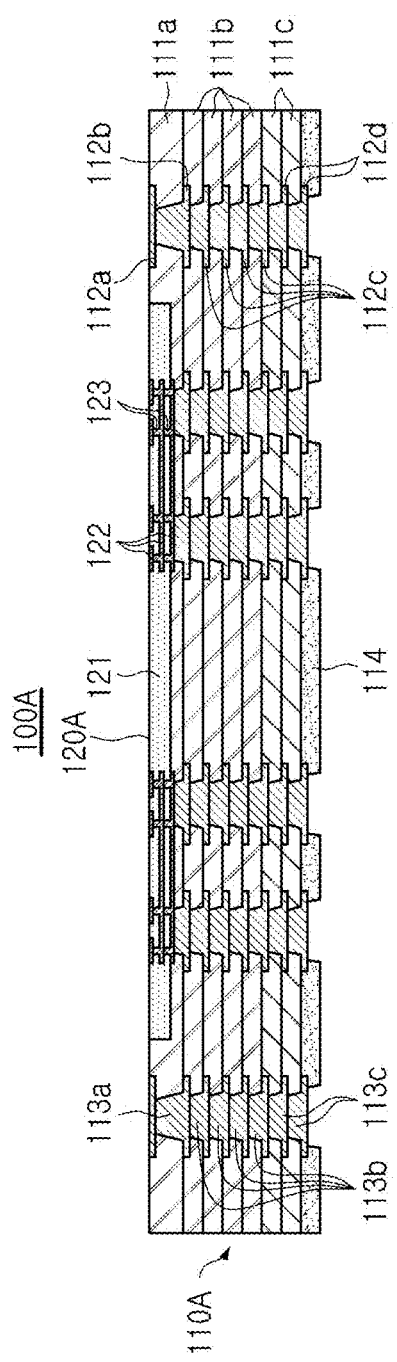

Referring to FIG. 7H, the copper foil M may be removed by an etching process. Through a series of the processes, the printed circuit board 100A according to the above-described example may be manufactured. However, an example embodiment thereof is not limited thereto, and the printed circuit board 100A according to the above-described example may be manufactured by a process different from the above example.

By first forming a fine wiring layer using a glass carrier, transferring the wiring layer to an organic carrier as is, and forming a substrate material thereon, contamination according to line cleanliness and issues on substrate handling may be effectively addressed.

Also, the other descriptions, for example, the descriptions described with respect to the printed circuit board 100A according to the above-described example may be applied, and the overlapping description thereof will not be provided.

Figure 8:
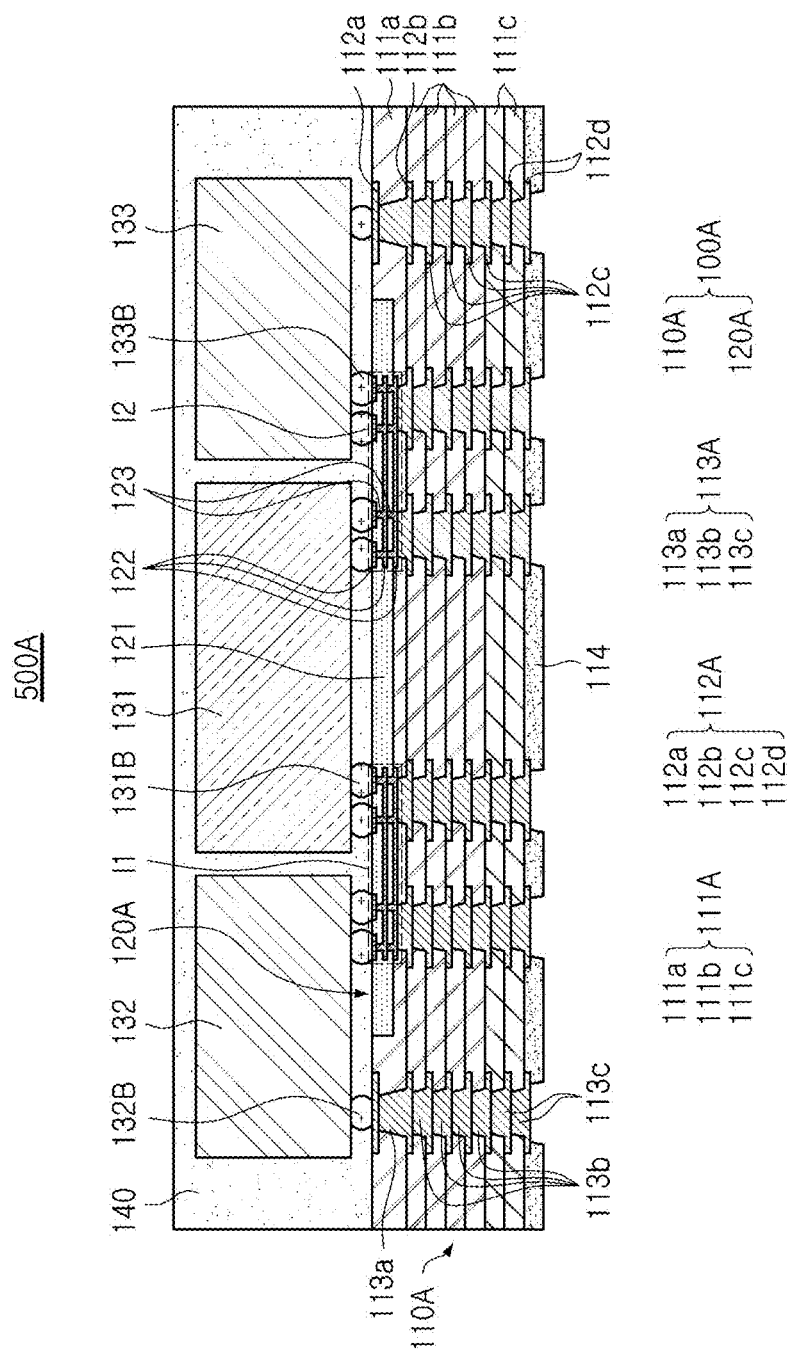
FIG. 8 is a cross-sectional diagram illustrating an example of a semiconductor package.

FIG. 8 is a cross-sectional diagram illustrating an example of a semiconductor package.

Referring to the drawings, the semiconductor package 500A may include a printed circuit board 100A described according to the above-described example, a first semiconductor chip 131 mounted on the printed circuit board 100A, a second semiconductor chip 132 mounted on the printed circuit board 100A and electrically connected to the first semiconductor chip 131 through the first connection region I1, and a third semiconductor chip 133 mounted on the printed circuit board 100A and electrically connected to the first semiconductor chip 131 through the second connection region I2. The first to third semiconductor chips 131, 132, and 133 may be mounted on the printed circuit board 100A through the first to third bumps 131B, 132B, and 133B, respectively. The first to third semiconductor chips 131, 132, and 133 may be covered with the molding material 140.

Each of the first to third semiconductor chips 131, 132, and 133 may include an integrated circuit (IC) die in which hundreds to millions of devices are integrated in a chip. In this case, the integrated circuit may be implemented as a logic chip such as, for example, a central processor (e.g., CPU), a graphics processor (e.g., GPU), a field programmable gate array (FPGA), a digital signal processor, a cryptographic processor, a microprocessor, a microcontroller, an application processor. (e.g., AP), analog-to-digital converter, an application-specific IC (ASIC), but an example embodiment thereof is not limited thereto, and the integrated circuit may be implemented as a memory chip such as a volatile memory (e.g., DRAM), a non-volatile memory (e.g., ROM), a flash memory, a high bandwidth memory (HBM), or another memory chip such as a power management IC (PMIC). For example, the first semiconductor chip 131 may include a logic chip such as a GPU, and the second and third semiconductor chips 132 and 133 may include a memory chip such as an HBM. Alternatively, the first to third semiconductor chips 131, 132, and 133 may be divided logic chips having different cores by being divided by die splitting.

Each of the first to third semiconductor chips 131, 132, and 133 may be formed based on an active wafer, and in this case, silicon (Si), germanium (Ge), gallium arsenic (GaAs) may be used as a base material included in each body. Various circuits may be formed in the body. A connection pad may be formed on each body, and the connection pad may include a conductive material such as aluminum (Al) or copper (Cu). The first to third semiconductor chips 131, 132, and 133 may be bare dies, and in this case, a metal bump may be disposed on the connection pads. The first to third semiconductor chips 131, 132, and 133 may be packaged dies. In this case, an additional redistribution layer may be formed on the connection pad, and a metal bump may be disposed on the redistribution layer.

The first to third semiconductor chips 131, 132, and 133 may be mounted on the printed circuit board 100A through the first to third bumps 131B, 132B, and 133B. For example, the first semiconductor chip 131 may be electrically connected to the uppermost second wiring layer 122 included in the first and second connection regions I1 and I2 of the interconnect structure 120A through the first bump 131B. Also, the second semiconductor chip 132 may be electrically connected to the uppermost second wiring layer 122 included in the first connection region I1 of the interconnect structure 120A and the left-side 1-1 wiring layer 112a of the substrate structure 110A through the second bump 132B. Also, the third semiconductor chip 133 may be electrically connected to the uppermost second wiring layer 122 included in the second connection region I2 of the interconnect structure 120A and the right-side 1-1 wiring layer 112a of the substrate structure 110A through the third bump 133B.

Each of the first to third bumps 131B, 132B, and 133B may be formed of a low-melting-point metal, such as, for example, solder such as tin (Sn)-aluminum (Al)-copper (Cu), but an example embodiment thereof is not limited thereto, and the material is not limited to any particular example thereto. Each of the first to third bumps 131B, 132B, and 133B may be formed as multiple layers or a single layer. When each of the first to third bumps 131B, 132B, and 133B is formed as multiple layers, the bumps may include a copper pillar and solder, and when the bumps are formed as a single layer, the bumps may include a tin-silver solder or copper, but an example embodiment thereof is not limited thereto.

The molding material 140 may protect the first to third semiconductor chips 131, 132, and 133. The material of the molding material 140 is not limited to any particular example, and a generally used molding material such as epoxy molding compound (EMC) may be used.

Also, the other descriptions, for example, the descriptions described with respect to the printed circuit board 100A according to the above-described example may be applied, and the overlapping description thereof will not be provided.

Figure 9:
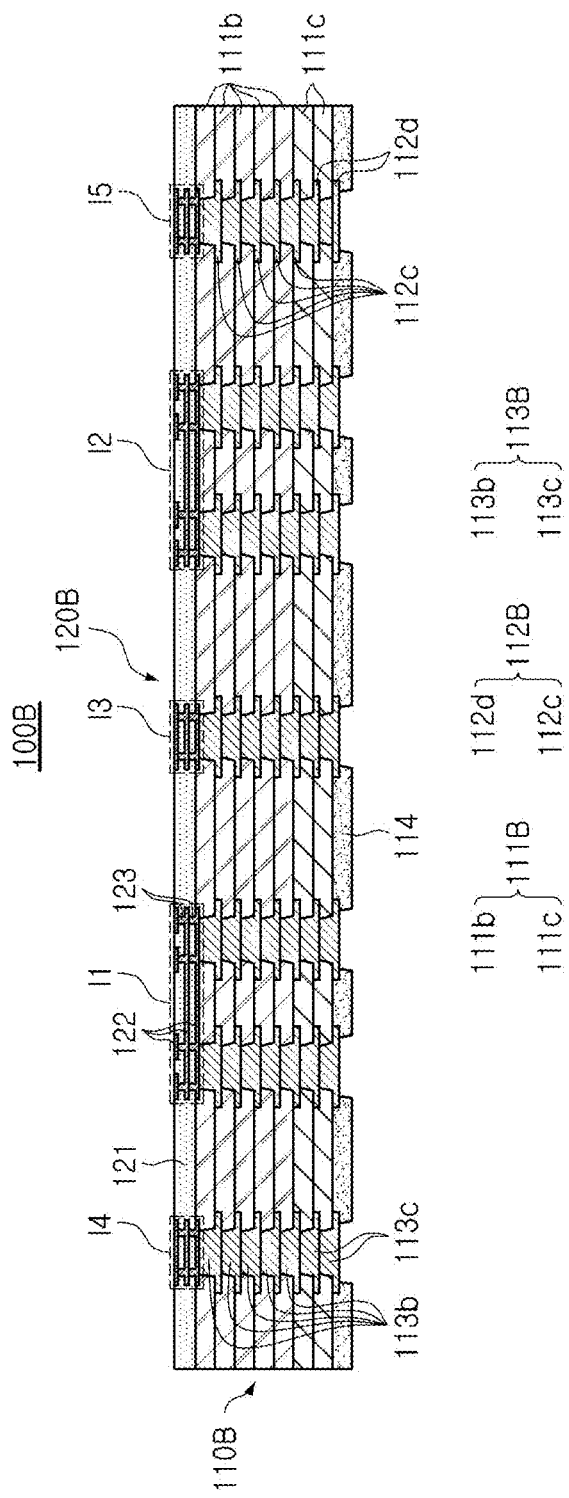
FIG. 9 is a cross-sectional diagram illustrating another example of a printed circuit board.

FIG. 9 is a cross-sectional diagram illustrating another example of a printed circuit board.

Referring to the drawings, similarly to the printed circuit board 100A according to an example, a printed circuit board 100B according to another example may include a substrate structure 110B including a first insulating material 111B, a plurality of first wiring layers 112B disposed on or in the first insulating material 111B, a plurality of first via layers 113B disposed in the first insulating material 111B, and an interconnect structure 120B disposed on an upper side of the substrate structure 110B and including a second insulating material 121, a plurality of second wiring layers 122 disposed on or in the second insulating material 121, and one or more second via layers 123 disposed in the second insulating material 121.

However, the interconnect structure 120B may be laminated on the upper side of the substrate structure 110B. Accordingly, the first insulating layer 111a, the 1-1 wiring layer 112a, the 1-2 wiring layer 112b, and the 1-1 via layer 113a may not be provided. For example, at least a portion of the lower surface of the second insulating material 121 may be covered with the first insulating material 111B, and a side surface of the second insulating material 121 may be exposed from the side surface of the first insulating material 111B. For example, the first insulating material 111B and the second insulating material 121 may have substantially the same area on a plane, that is, for example, a planar area. Substantially the same planar area may indicate that the areas may be the same within an error range, and may include the example in which the planar areas may be entirely the same, or may be almost the same. In this case, since the second insulating material 121 of the interconnect structure 120B may solely provide the outermost mounting surface on which the semiconductor chip is mounted, flatness of the front surface may be more excellent, and accordingly, the packaging yield may further improve.

Also, the interconnect structure 120B may further include third to fifth connection regions I3, I4, and I5, and the first to fifth connection regions I1, I2, I3, I4, and I5 may be spaced apart from each other and may not be connected to each other within the interconnect structure 120B. Each of the first to fifth connection regions I1, I2, I3, I4, and I5 may include a wiring layer and a via layer. For example, the first to fifth connection regions I1, I2, I3, I4, and I5 may include different portions of the plurality of second wiring layers 122 and different portions of the plurality of second wiring layers 122. In this case, the electrical connection between the semiconductor chips and the electrical connection between the semiconductor chip and the substrate structure 110B may be simultaneously addressed through the plurality of connection regions I1, I2, I3, I4, and I5 distinct from each other, and accordingly, an interconnect-related alignment issue may be effectively addressed.

Also, the other descriptions, for example, the descriptions described with respect to the printed circuit board 100A according to the above-described example may be applied, and the overlapping description thereof will not be provided.

FIGS. 10A to 10H are diagrams illustrating an example of processes of manufacturing a printed circuit board.

Figure 10A:
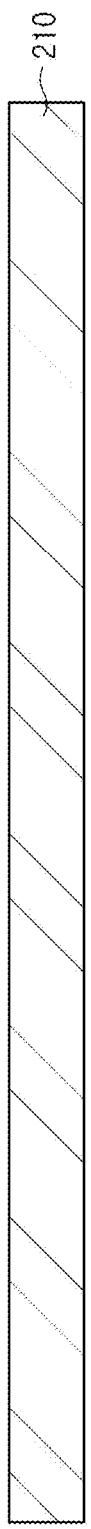
FIGS. 10A to 10H are diagrams illustrating an example of processes of manufacturing a printed circuit board.

Referring to FIG. 10A, the first carrier 210 may be prepared.

Figure 10B:
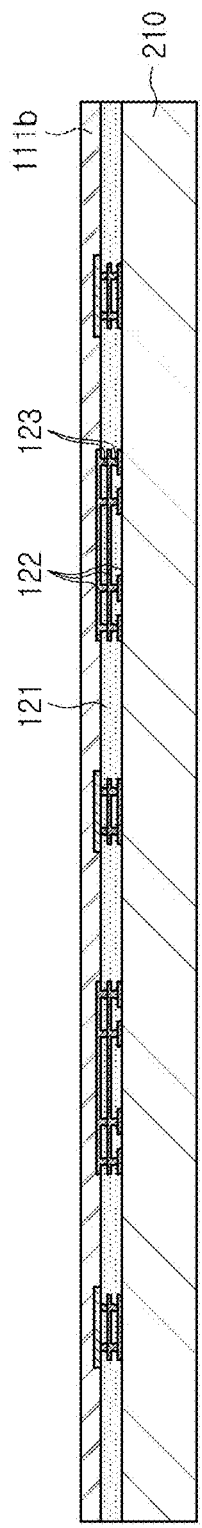

Referring to FIG. 10B, a precursor of the interconnect structure 120B of the ETS structure including a second insulating material 121, a plurality of second wiring layers 122, and a plurality of second via layers 123 may be formed on the first carrier 210 using a coreless process. A portion of the plurality of second insulating layers 111b may be disposed on the precursor of the interconnect structure 120B and may protect the plurality of second wiring layers 122.

Figure 10C:
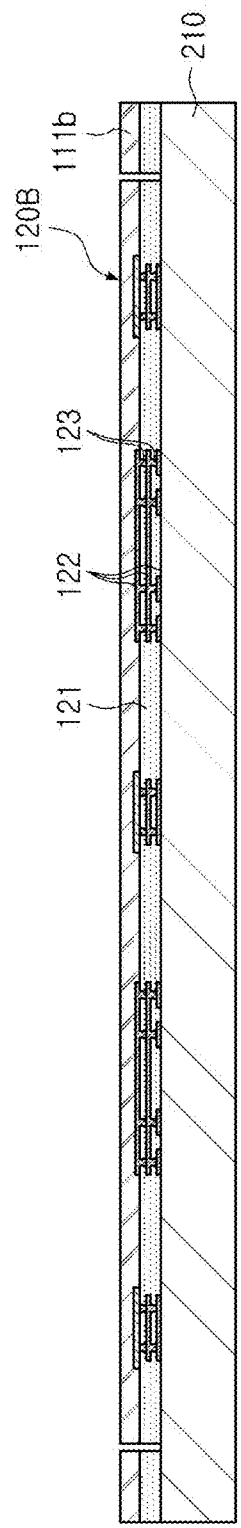

Referring to FIG. 10C, the interconnect structure 120B may be formed by cutting the precursor of the interconnect structure 120B to an appropriate size using a sawing process. Thereafter, the interconnect structure 120B may be separated from the first carrier 210.

Figure 10D:
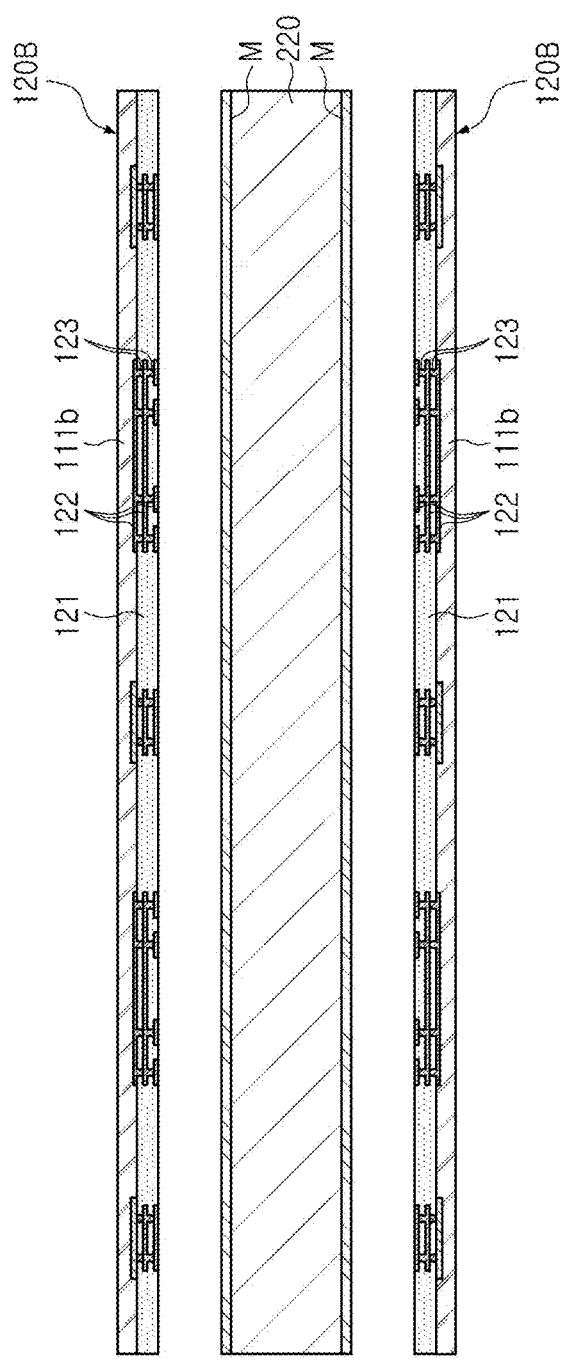

Referring to FIG. 10D, the second carrier 220 may be prepared. Thereafter, the interconnect structure 120B prepared in advance may be disposed on the copper foil M.

Figure 10E:
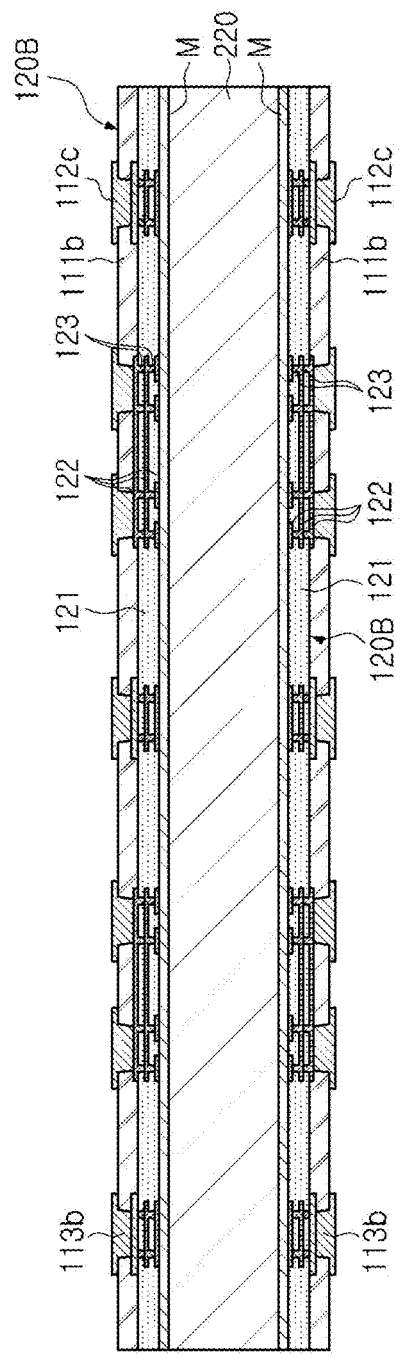

Referring to FIG. 10E, a via hole may be processed in the second insulating layer 111b, a plating process may be performed, thereby forming a 1-3 wiring layer 112c and a 1-2 via layer 113b.

Figure 10F:
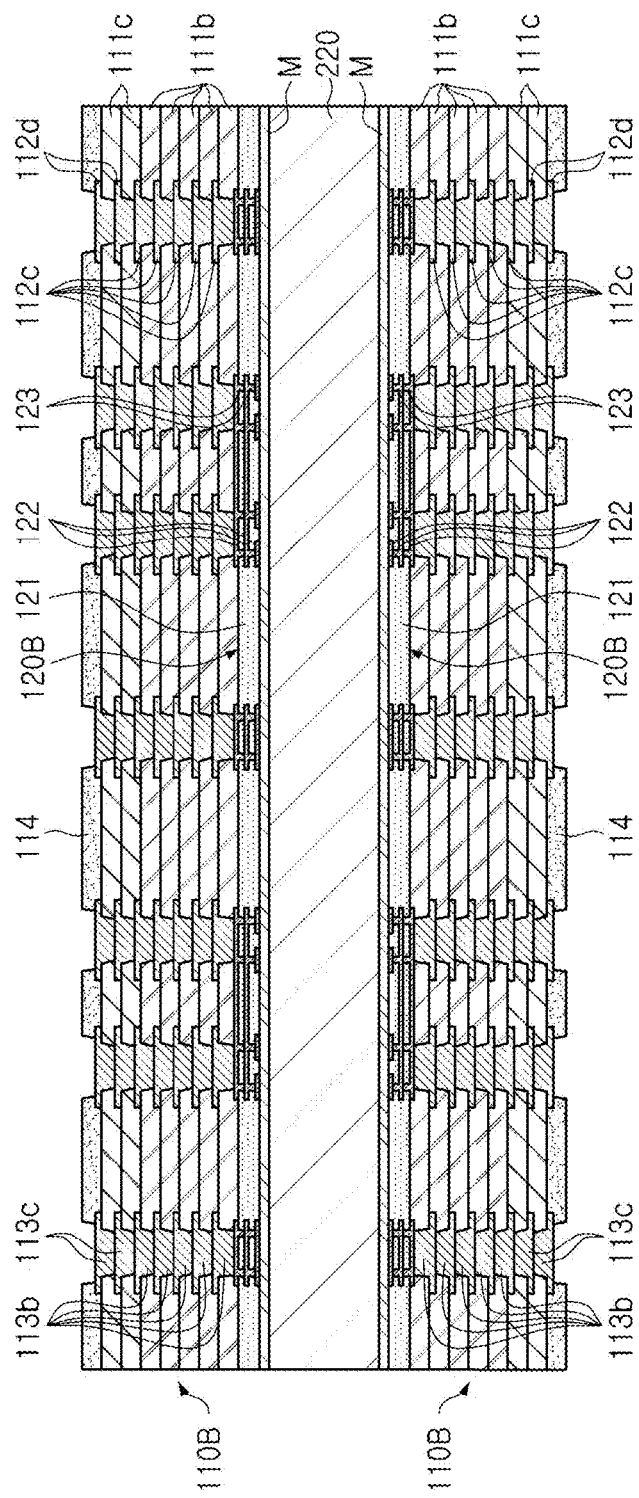

Referring to FIG. 10F, a plurality of second insulating layers 111b and a plurality of third insulating layers 111c may be further laminated on the first insulating layer 111a, and the plurality of 1-3 wiring layers 112c, the plurality of 1-4 wiring layers 112d, the plurality of 1-2 wiring layers 113b and the plurality of 1-3 via layers 113c may be further formed by performing a via hole process and a plating process may be performed in each of the plurality of second insulating layers 111b and the plurality of third insulating layers 111c. Thereafter, if desired, the passivation layer 114 may be formed on the outermost side by applying solder resist or ABF lamination, and a plurality of openings may be formed in the passivation layer 114 by a photolithography process or laser process. Through a series of the processes, the substrate structure 110B may be formed on the interconnect structure 120B.

Figure 10G:
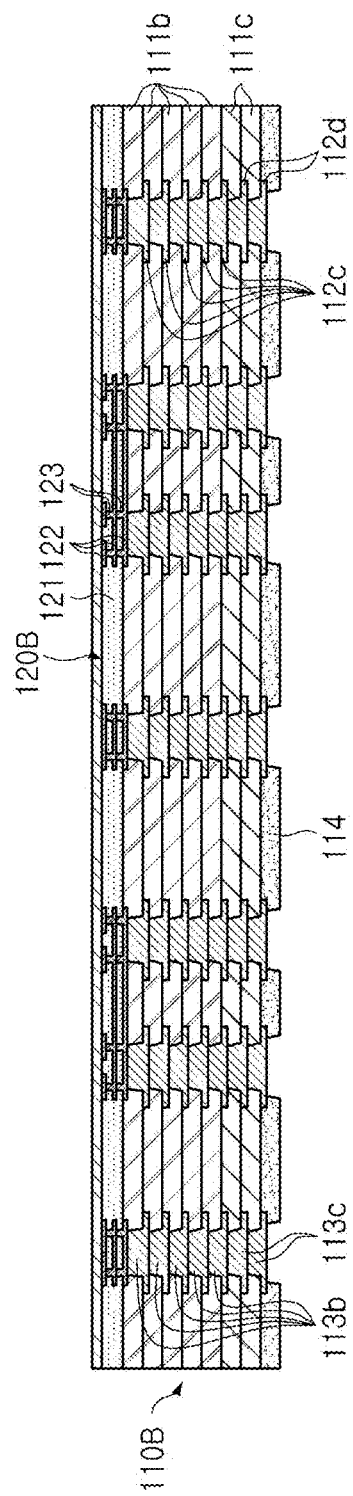

Referring to FIG. 10G, the copper foil M may be separated from the second carrier 220. An interconnect structure 120B and a substrate structure 110B laminated on the interconnect structure 120B may be disposed on the separated copper foil M.

Figure 10H:
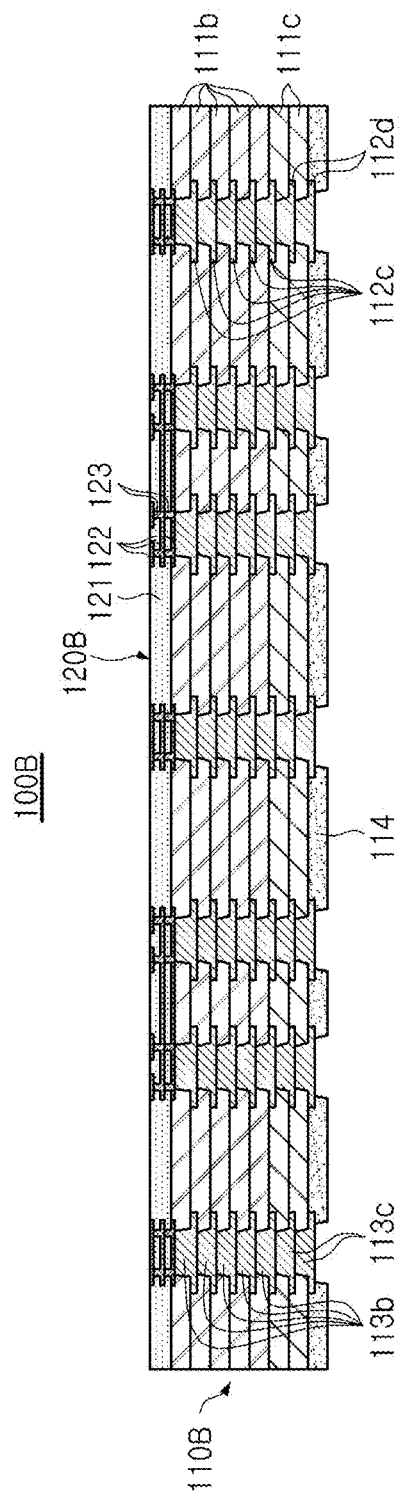

Referring to FIG. 10H, the copper foil M may be removed by an etching process. Through a series of the processes, the printed circuit board 100B according to another example described above may be manufactured. However, an example embodiment thereof is not limited thereto, and the printed circuit board 100B according to another example described above may be manufactured by a different process.

The other descriptions, for example, the descriptions described with respect to the printed circuit board 100A and the printed circuit board 100B according to the above-described example may be applied, and the overlapping description thereof will not be provided.

Figure 11:
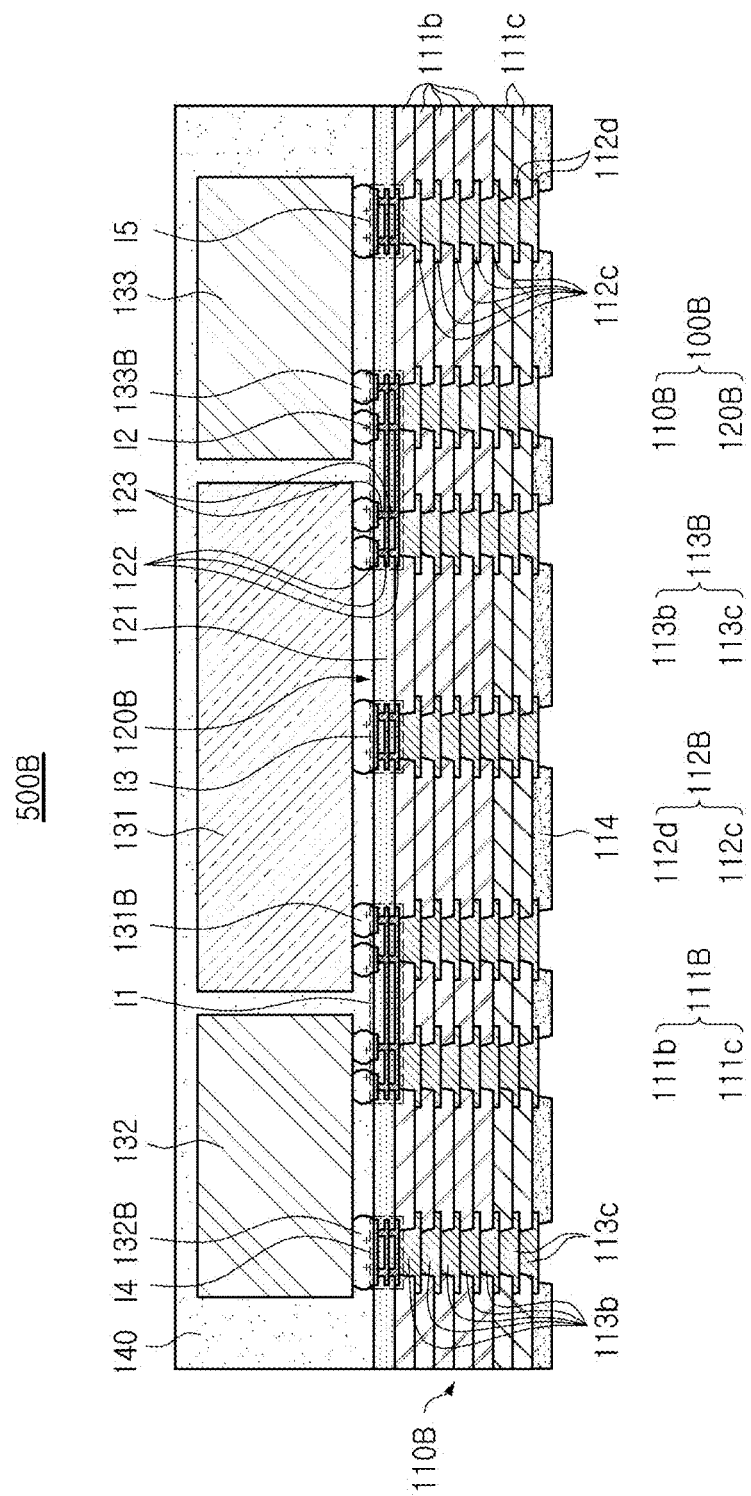
FIG. 11 is a cross-sectional diagram illustrating another example of a semiconductor package.

FIG. 11 is a cross-sectional diagram illustrating another example of a semiconductor package.

Referring to the drawings, the semiconductor package 500B according to another example may include a printed circuit board 100B, a first semiconductor chip 131 mounted on the printed circuit board 100B and electrically connected to the substrate structure 110B through the connection region I3, a second semiconductor chip 132 mounted on the printed circuit board 100B, electrically connected to the first semiconductor chip 131 through the first connection region I1, and electrically connected to the substrate structure 110B through the connection region I4, and a third semiconductor chip 133 mounted on the printed circuit board 100B, electrically connected to the first semiconductor chip 131 through the second connection region I2 and electrically connected to the printed circuit board 100B through the fifth connection region I5. The first to third semiconductor chips 131, 132, and 133 may be mounted on the printed circuit board 100B through the first to third bumps 131B, 132B, and 133B, respectively. The first to third semiconductor chips 131, 132, and 133 may be covered with the molding material 140.

As such, in the semiconductor package 500B according to another example, the first to third semiconductor chips 131, 132, and 133 may be electrically connected to different portions of the plurality of first wiring layers 112B of the substrate structure 110B through the third to fifth connection regions I3, I4, and I5 of the interconnect structure 120B.

The other descriptions, for example, the descriptions described with respect to the printed circuit board 100A and the printed circuit board 100B according to the above-described example may be applied, and the overlapping description thereof will not be provided.

According to the aforementioned example embodiments, a printed circuit board which may address an alignment issue related to interconnection which may accumulate as the number of semiconductor chips to be mounted increases, and a semiconductor package including the same may be provided.

Also, a printed circuit board of which flatness of a front surface on which a semiconductor chip is mounted may be excellent such that a packaging yield may improve, and a semiconductor package including the same may be provided.

In the present disclosure, the meaning on a cross-section may mean a cross-sectional shape when the object is vertically cut, or a cross-sectional shape when the object is viewed from a side-view. Also, the meaning on a plane may be a shape when the object is horizontally cut, or a planar shape when the object is viewed from a top-view or a bottom-view.

In the present disclosure, the lower side, the lower side, the lower surface, or the like, are used to mean the direction toward the mounting surface of the semiconductor package including the organic interposer based on the cross-section of the drawing for convenience, and the upper side, the upper side, the upper surface, or the like, are the opposite direction was used. However, it goes without saying that the direction is defined for convenience of description, and the scope of the claims is not limited to any particular example by the description of this direction.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
   a substrate structure including a first insulating material, a plurality of first wiring layers disposed on or in the first insulating material, and a plurality of first via layers disposed in the first insulating material; and
   an interconnect structure including a second insulating material, a plurality of second wiring layers disposed on or in the second insulating material, and one or more second via layers disposed in the second insulating material,
   wherein an upper surface of the second insulating material is exposed from an upper surface of the first insulating material, and at least a portion of each of a lower surface and a side surface of the second insulating material is covered with the first insulating material,
   wherein the interconnect structure is disposed on an upper side of the substrate structure,
   wherein the interconnect structure includes first and second connection regions, and wherein the first and second connection regions are spaced apart from each other.

2. The printed circuit board of claim 1, wherein the first and second connection regions include different portions of the plurality of second wiring layers and different portions of the one or more second via layers, respectively.

3. The printed circuit board of claim 1,
wherein the interconnect structure further includes third to fifth connection regions, and
wherein the first to fifth connection regions are spaced apart from each other.

4. The printed circuit board of claim 3, wherein the first to fifth connection regions include different portions of the plurality of second wiring layers and different portions of the one or more second via layers, respectively.

5. The printed circuit board of claim 1, wherein an average pitch of wirings included in the plurality of second wiring layers is smaller than an average pitch of wirings included in the plurality of first wiring layers.

6. The printed circuit board of claim 5, wherein an average interlayer insulation distance between the plurality of second wiring layers is smaller than an average interlayer insulation distance between the plurality of first wiring layers.

7. The printed circuit board of claim 1, wherein a second wiring layer disposed on an uppermost side of the plurality of second wiring layers is embedded in an upper side of the second insulating material and has an upper surface exposed from an upper surface of the second insulating material.

8. The printed circuit board of claim 1, wherein the second insulating material has a planar area smaller than that of the first insulating material.

9. The printed circuit board of claim 1,
wherein a first wiring layer disposed on an uppermost side of the plurality of first wiring layers and a first via layer disposed on an uppermost side of the plurality of first via layers are disposed around the second insulating material, and
wherein the first wiring layer disposed on the uppermost side of the plurality of first wiring layers is embedded in an upper side of the first insulating material and has an upper surface exposed from the upper surface of the first insulating material.

10. The printed circuit board of claim 1,
wherein the first insulating material includes a plurality of first insulating layers laminated on an upper side and a plurality of second insulating layers laminated on a lower side, and
wherein the plurality of first and second insulating layers include different insulating materials.

11. The printed circuit board of claim 10, wherein each of the second insulating layers has an elastic modulus greater than that of each of the first insulating layers.

12. The printed circuit board of claim 1,
wherein the first and second connection regions are not connected to each other in the interconnect structure.

13. A printed circuit board, comprising:
a substrate structure including a first insulating material, a plurality of first wiring layers disposed on or in the first insulating material, and a plurality of first via layers disposed in the first insulating material; and
an interconnect structure including a second insulating material, a plurality of second wiring layers disposed on or in the second insulating material, and one or more second via layers disposed in the second insulating material,
wherein the interconnect structure is disposed on an upper side of the substrate structure,
wherein the interconnect structure includes first and second connection regions, wherein the first and second connection regions are spaced apart from each other, and
wherein at least a portion of a lower surface of the second insulating material is covered with the first insulating material, and a side surface of the second insulating material is exposed from the first insulating material.

14. The printed circuit board of claim 13, wherein the first and second insulating materials have substantially the same planar area.

15. A semiconductor package, comprising:
a printed circuit board including a substrate structure and an interconnect structure disposed on an upper side of the substrate structure, where the interconnect structure includes first and second connection regions including a wiring layer and a via layer, respectively, and the first and second connection regions are spaced apart from each other;
a first semiconductor chip mounted on the printed circuit board;
a second semiconductor chip mounted on the printed circuit board and connected to the first semiconductor chip through the first connection region; and
a third semiconductor chip mounted on the printed circuit board and connected to the first semiconductor chip through the second connection region,
wherein the substrate structure comprises a plurality of first insulating layers and the interconnection structure comprises a plurality of second insulating layers having different materials,
wherein at least a portion of each of a lower surface and side surface of at least one of the plurality of second insulating layers is covered with a corresponding of the plurality of first insulating layers.

16. The semiconductor package of claim 15,
wherein the interconnect structure further includes third to fifth connection regions, and
wherein the first to fifth connection regions are spaced apart from each other.

17. The semiconductor package of claim 16,
wherein the substrate structure includes a plurality of wiring layers and a plurality of via layers, and
wherein the first to third semiconductor chips are connected to different portions of the plurality of wiring layers of the substrate structure through the third to fifth connection regions, respectively.

18. The semiconductor package of claim 15, wherein the interconnect structure provides an outermost mounting surface of the printed circuit board on which the first to third semiconductor chips are mounted.

19. A printed circuit board, comprising:
a substrate structure including a first insulating material, a plurality of first wiring layers disposed on or in the first insulating material, and a plurality of first via layers disposed in the first insulating material; and
an interconnect structure including a second insulating material, a plurality of second wiring layers disposed on or in the second insulating material, and one or more second via layers disposed in the second insulating material,
wherein a side surface of an uppermost portion of the second insulating material is in contact with the first insulating material, wherein one or more vias of the plurality of first via layers extends from one of the plurality of second wiring layers, and wherein the first insulating material and the second insulating material provide portions of an outermost surface of the printed circuit board.

20. The printed circuit board of claim 19, wherein an average pitch of wirings included in the plurality of second wiring layers is smaller than an average pitch of wirings included in the plurality of first wiring layers.

21. The printed circuit board of claim 19, wherein an average interlayer insulation distance between the plurality of second wiring layers is smaller than an average interlayer insulation distance between the plurality of first wiring layers.

22. The printed circuit board of claim 19, wherein the first insulating material includes a plurality of insulating layers and the second insulating material includes a plurality of insulating layers, and wherein an uppermost insulating layer of the first insulating material and an uppermost insulating layer of the second insulating material are coplanar with each other.

23. The printed circuit board of claim 22, wherein an uppermost wiring layer of the plurality of first wiring layers and an uppermost wiring layer of the plurality of second wiring layers are coplanar with the uppermost insulating layer of the first insulating material and the uppermost insulating layer of the second insulating material.

\* \* \* \* \*